United States Patent

Todokoro et al.

[11] Patent Number: 5,929,439
[45] Date of Patent: Jul. 27, 1999

[54] SCANNING MICROSCOPE

[75] Inventors: Hideo Todokoro, Hinode-cho; Osamu Yamada, Hitachinaka, both of Japan

[73] Assignee: Hitachi, Ltd., Tokyo, Japan

[21] Appl. No.: 08/868,650

[22] Filed: Jun. 4, 1997

[30] Foreign Application Priority Data

Jul. 6, 1996 [JP] Japan .................................. 8-145447

[51] Int. Cl.$^6$ .................................................. H01J 37/26
[52] U.S. Cl. ................................................................ 250/310
[58] Field of Search .................................. 250/310, 306, 250/307, 311

[56] References Cited

U.S. PATENT DOCUMENTS 3,628,012  12/1971  Plows et al. ............................ 250/310
3,714,422  1/1973   Hosoki et al. .......................... 250/310
3,795,808  3/1974   Drayton et al. ......................... 250/310
5,500,528  3/1996   Matsui et al. .......................... 250/310

FOREIGN PATENT DOCUMENTS 2295046  12/1990  Japan .

*Primary Examiner*—Kiet T. Nguyen
*Attorney, Agent, or Firm*—Kenyon & Kenyon

[57] ABSTRACT

A scanned image to be observed or to be recorded is formed by a plurality of two-dimensional scanning times (N times), an irradiating charged particle beam or a light beam is blanked in a two-dimensional scanning unit, and the averaged irradiation intensity is adjusted by thinning a plurality (<N) of scanning times among the N times of scanning.

18 Claims, 7 Drawing Sheets

TWO-DIMENSIONAL SCANNING

BEAM CURRENT

TWO-DIMENSIONAL SCANNED IMAGE

−8  −7  −6  −5  −4  −3  −2  −1  +1

ACCUMULATION OF SCANNED IMAGE t=0

TIME →

TWO-DIMENSIONAL SCANNING

BEAM CURRENT

TWO-DIMENSIONAL SCANNED IMAGE

−8  −7  −6  −5  −4  −3  −2  −1  +1

ACCUMULATION OF SCANNED IMAGE t=0

TIME ⟶

FIG.5A

| IP=8pA |
|---|
| IP=6pA |
| IP=4pA |
| IP=2pA |

FIG.5B

| IP=8pA |
|---|
| IP=7pA |
| IP=6pA |
| IP=5pA |
| IP=4pA |
| IP=3pA |
| IP=2pA |
| IP=1pA |

SCANNING MICROSCOPE

FIELD OF THE INVENTION

The present invention relates to a scanning microscope in which a scanned image is obtained by scanning a charged particle beam or a light beam on a sample to be inspected, and more particularly to a scanning microscope which can reduce effects on the sample such as heating, contamination, charging-up by easily controlling intensity of the charged particle beam or the light beam to be scanned on the sample.

BACKGROUND OF THE INVENTION

In a scanning microscope, an image can be obtained by scanning a charged particle beam or a light beam and detecting signals secondarily obtained there and then performing brightness modulation of a cathode-ray tube scanned in synchronism with the scanned charged particle beam or the scanned light beam. Intensity of the charged particle beam or the light beam to be irradiated on a sample is adjusted by taking effects on the sample such as temperature rising, contamination, charging-up into consideration. When a scanning electron microscope is taken as an example, adjusting of the intensity has been performed by changing the conditions of the electron optical system forming an electron beam to be scanned such as quantity of electrons emitted from an electron source, condensing ratio, magnitude of aperture. However, if the conditions of the electron optical system is changed, the optical axis of the electron optical system will not stay in adjustment, i.e., will be shifted. Therefore, it has been required to adjust the optical axis again.

As described above, it is required to readjust the optical axis if the intensity of electron beam to be irradiated on the sample is changed. A skilled technique is required to rapidly perform the readjustment, and it requires a 10- to 20-minute adjusting time. For this reason, an apparatus practically used is apt to be used while the intensity of the electron beam is fixed constant, and is not always used under the optimum observation condition. Therefore, there have arisen problems such as change in shape due to temperature rise, elimination of very fine portions due to contamination, deformation of image due to charging-up and so on.

SUMMARY OF THE INVENTION

An object of the present invention is to provide a scanning microscope in which intensity of electron beam irradiated on a sample can be easily changed without readjusting the optical axis.

In order to attain the above-mentioned object, the present invention employs the following construction.

The scanning microscope is provided with a function for periodically blanking electron irradiation with setting a unit of two-dimensional scanning, and the average irradiated electron intensity is varied by changing the blanking ratio. There is a potential problem that the scanned image obtained here will have flickers. However, the flickers in the scanned image due to blanking can be reduced as low as practically acceptable by setting the two-dimensional scanning frequency to the commercial television frequency and by accumulating and displaying a plurality of two-dimensional images.

By employing this means, it is possible to easily set the electron beam intensity to an appropriate value suitable for a sample condition without adjusting the optical axis, and to set the observing conditions such as temperature rising, charging-up, contamination and so on to an optimum conditions to thereby solve the problem mentioned above.

Further, since the present invention employs not a simple blanking but blanking by a two-dimensional scanning unit, it is easy to apply the present invention to the technology in which a sample image is obtained by accumulating scanned images.

In other words, the present invention can be directly applied to a technology in which a sample image is obtained by accumulating a plurality of scanned images, without complex calculating means.

The reason is that, in the present invention, stopping of electron beam irradiation to a sample can be performed simply by applying a deflecting voltage to an electrode provided for blanking and there is no need to change conditions of the other components at all. That is, in the present invention, blanking can be performed while the output of the charged particle beam and voltage applied to the deflecting electrodes for two-dimensional scanning are kept fixed to constant values.

Furthermore, according to the present invention, in addition to the above-mentioned construction, the following constructions may be employed in order to attain the same effect as the above.

The same effect can be attained by superposing a blanking deflection signal on the voltage applied to the deflecting electrodes for two-dimensional scanning.

BRIEF DESCRIPTION OF THE DRAWINGS

FIG. 5A and FIG. 5B are views showing an example of display of beam currents which can be selected.

DESCRIPTION OF THE PREFERRED EMBODIMENTS

Figure 1:
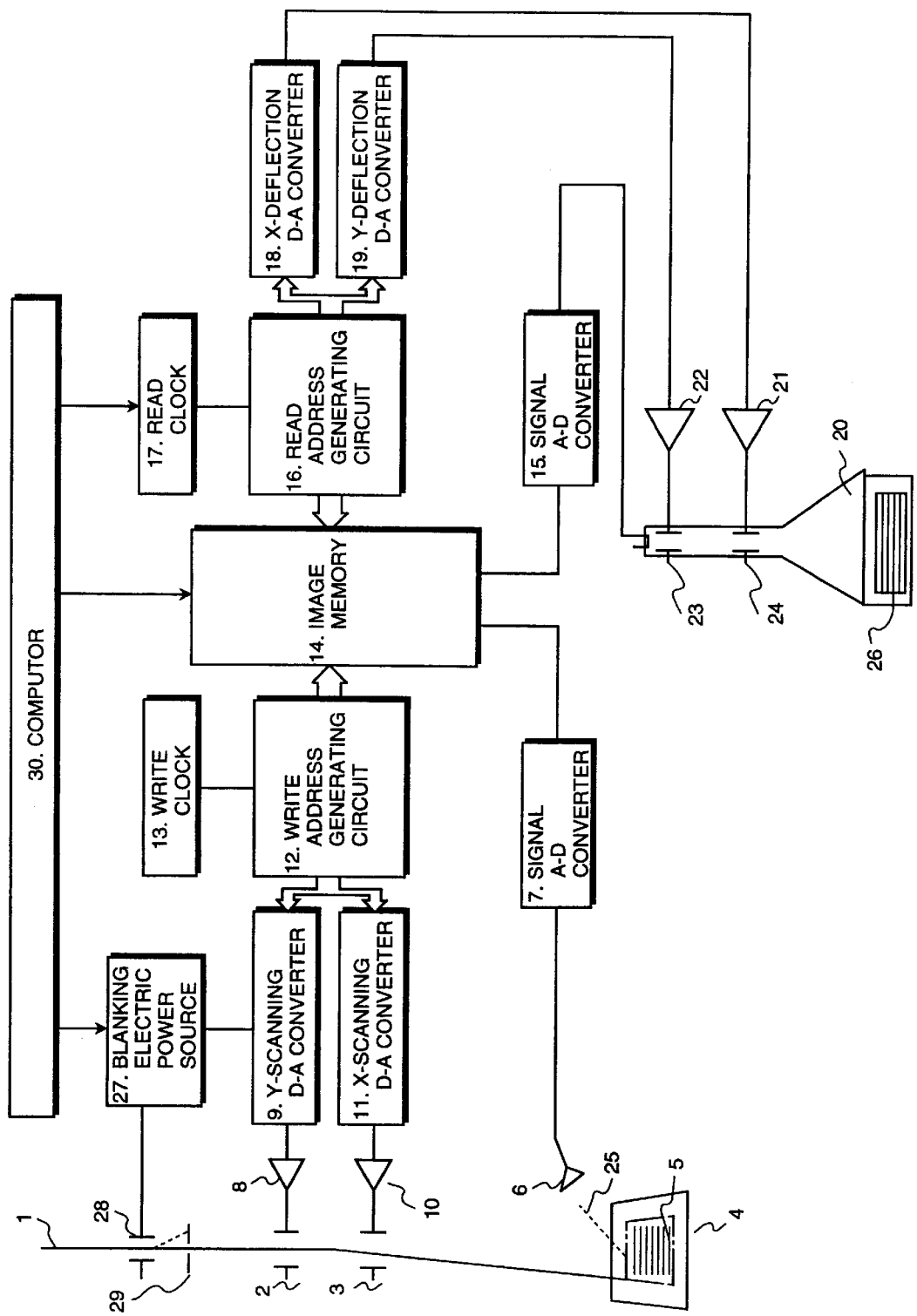
FIG. 1 is a diagram showing an embodiment of a scanning microscope in accordance with the present invention.

FIG. 1 shows an embodiment of a scanning microscope to which the present invention is applied. A finely focused electron beam 1 is irradiated, with two-dimensional scanning 5, on a sample 4 to be observed using a scanning deflection plate (Y) 2 and a scanning deflection plate (X) 3. Here, a focusing system for focusing the electron beam 1 is not shown in the figure. The reference character 14 indicates an image memory which is, for example, of 512×512 pixels and has 256 levels of halftone in the depth direction. A write address generating circuit 12 is operated by a write clock 13 for a synchronizing signal. Speed of the write clock 13 determines one scanning time of the two-dimensional scanning. For example, when a cycle of the write clock 13 is 60 ns, it becomes the TV scanning performing one two-dimensional scanning every 1/60 second. The cycle of the clock can be arbitrarily determined, and it is possible to construct a slow scanning system which scans one picture of the image per second.

An address signal corresponding to a memory position of the image memory 14 is generated in the write address generating circuit 12 and is output to a Y-scanning D-A converter 9 and an X-scanning D-A converter 11. The address signal output to the X-scanning D-A converter 11 is a digital signal which repeats from 0 to 512, and is converted into an analog signal. The signal output to the Y-scanning D-A converter 9 is a digital signal which repeats from 0 to 512 and is increased by one when the output of the X-scanning D-A converter 11 reaches 512 from 0, and is converted into an analog signal of saw-tooth shaped wave. These saw-tooth shaped wave analog signals are amplified with a Y-scanning amplifier 8 and an X-scanning amplifier 10, and are supplied to the scanning deflection plate (Y) 2 and the scanning deflection plate (X) 3. The size of the two-dimensional scanning 5 of the electron beam 1 on the sample 4 can be varied by changing amplification factors of the Y-scanning amplifier 8 and the X-scanning amplifier 10.

As the electron beam 1 is scanned on the sample 4, secondary electrons 25 are emitted by the electron irradiation. Although reflected electrons and the like are also emitted, explanation here will be made with the secondary electrons as the typical electrons. The secondary electrons 25 are detected by a secondary electron detector 6, and the detected signal is converted to a digital signal by a signal A-D converter 7 to be stored in the image memory 14. Since the address of the image memory 14 corresponds to an address scanned by the electron beam 1, a two-dimensional image of the two-dimensional scanning 5 in the sample 4 is stored in the image memory 14. The signals in the image memory 14 can be sequentially read in time sequence with a read address generating circuit 16 in synchronism with a read clock 17. The signals read out in correspondence with the address are converted from digital signals to analog signals by a signal D-A converter 15. The analog signals are used as a brightness modulation input to an image display cathode-ray tube 20.

On the other hand, an address signal corresponding to the read address generating circuit 16 controlled by the read clock 17 is output to an X-deflecting D-A converter 18 and a Y-deflecting D-A converter 19 to be converted to voltages by an X-deflection amplifier 21 and a Y-deflection amplifier 22. The converted voltages are supplied to an X-deflection plate 23 and a Y-deflection plate 24 of the image display cathode-ray tube 20 to scan an electron beam of the cathode-ray tube in a rectangular shape. A distal signal read out of the image memory 14 by a read address signal is converted to an analog signal by the signal D-A converter 15 and is used as a brightness modulation input of the image display cathode-ray tube 20. As a result, a scanned image 26 of the sample 4 is displayed on the image display cathode-ray tube 20 as a scanned image 26. To do this it is not necessary that the speed of the read clock 17 is equal to the speed of the write clock 13. Although most of scanning electron microscopes in the past are of a slow speed scanning type having 10 seconds per one scanning, scanning electron microscopes having a faster scanning speed currently become dominant. One example is a scanning electron microscope having one scanning time of 1/60 second equal to the TV frequency.

Figure 2A:
FIG. 2A to FIG. 2D are charts explaining a method of displaying an accumulated image.
Figure 2B:
Figure 2C:
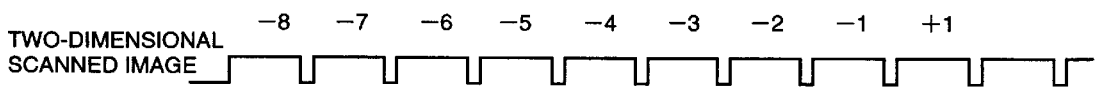
Figure 2D:
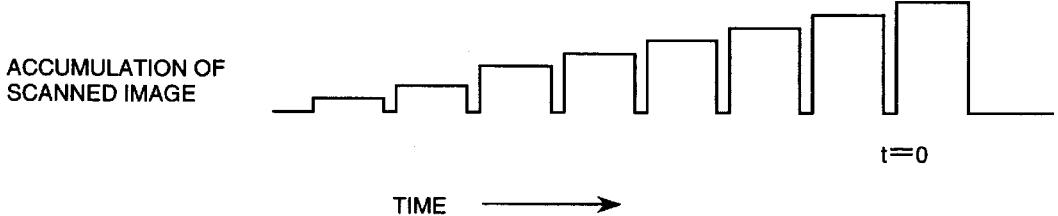

In a case where the write clock 13 has a fast speed, addition of images is performed in order to improve the S/N ratio. For example, an image is displayed by superposing eight scanned images in order to improve the S/N ratio. A scanned image superposing display will be explained below, referring to FIG. 2A to FIG. 2D. Exactly speaking, "eight times of scanning" to be explained here is not a number of scanning operations, but is scanning to form one picture of a complete image. For example, TV technology employs a method of so-called "interlace" in which one picture of complete image is formed by two times of a 1/60-second scanning. There is also a method in which one picture of a complete image is formed by four times of scanning. Hereinafter, the scanning to form one picture of complete image will be referred to as "two-dimensional scanning", and the obtained image will be referred to as a "two-dimensional scanned image". In this explanation, one two-dimensional scanned image is formed by two times of scanning. FIG. 2A shows the feature of two-dimensional scanning which shows a saw-tooth shaped wave of Y-scanning. FIG. 2B shows the feature of an electron beam irradiation on a sample, where the electrons are continuously irradiated. FIG. 2C shows the feature of forming a two-dimensional scanned image, and the two-dimensional scanned image is formed corresponding to two times of Y-scanning. FIG. 2D shows the feature to perform accumulation of scanned images in order to improve the S/N ratio of the two-dimensional scanned image. Two-dimensional scanned images, from (−1) to (−8) of eight scanning times antecedent to an observation time point (t=0) are accumulated and an arithmetic mean value is displayed as a S/N ratio improved two-dimensional scanned image. When the next two-dimensional scanning (+1) is executed, the two-dimensional scanned image (+1) is added and the two-dimensional scanned image (−8) is erased. Although the mean value in this explanation is an evenly averaged value of eight two-dimensional scanned images, it may be possible to employ a weighted arithmetic mean value in which the accumulated value of the two-dimensional scanned images from (−1) to (−8) is multiplied by 7/8 and then added with the next scanned image (+1).

The present invention relates to a method of adjusting and controlling irradiation intensity, that is, beam current of the electron beam 1 on the sample 4 which is extremely effective when it is applied to a such scanning electron microscope performing observation of a sample, recording and capturing into a computer, using an arithmetic mean value of two-dimensional scanned images. In order to attain the object, as shown in FIG. 1, a blanking deflection plate 28 and a blanking aperture 29 are provided in the path of the electron beam 1. A blanking electric power source 27 generates a rectangular voltage in synchronism with the Y-scanning D-A converter to blank the electron beam 1 being scanned by a two-dimensional scanning unit. The blanking operation is controlled by the computer 30.

Figure 3A:
FIG. 3A to FIG. 3D are charts explaining a method of displaying an accumulated image when blanking is performed.
Figure 3B:
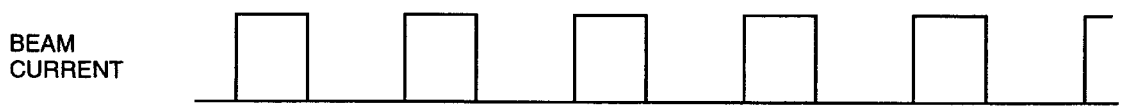
Figure 3C:
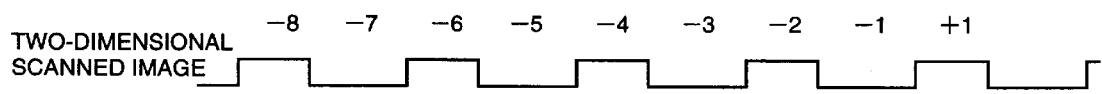
Figure 3D:
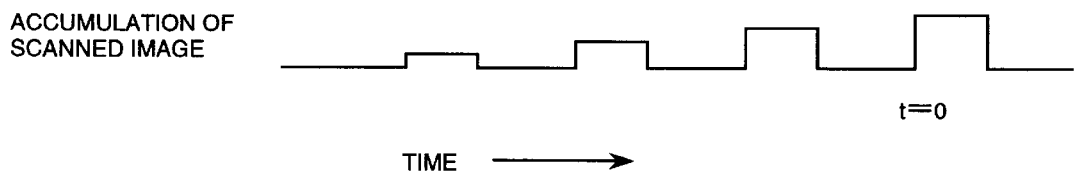

The blanking operation will be described below, referring to FIG. 3A to FIG. 3D. FIG. 3A shows the feature of two-dimensional scanning which shows the same saw-tooth shaped wave of Y-scanning as in FIG. 2A. FIG. 3B shows the feature of an electron beam irradiation on a sample which is controlled by blanking. In this example, blanking is performed every other two-dimensional scanning. FIG. 3C shows the feature of forming a two-dimensional scanned image. FIG. 3D shows the state of displaying an averaged image obtained by eight scanning operations through the arithmetic mean value processing of the two-dimensional scanned images. The processing is executed by averaging the images of eight scanning operations, but actually it is an averaged image obtained by four scanning times because the two-dimensional scanned image is formed every other scanning. As a result, the intensity of the accumulated image is reduced, but this problem can be solved by amplifying the signal depending on the degree of blanking. An observer hardly notices a sense of incongruity such as flickering when the thinning-outs of the two-dimensional scanned images are within the number of the arithmetic mean value processing operations (within the adding period). It must be noted here that the intensity of the electron beam (the beam current) becomes one-half of that in a continuous irradiation. Although the decrease in the intensity of the electron beam is not continuous but on average, the effect on the sample can be decreased to one-half. Further it must be noted that the beam current can be instantly changed at an arbitrary timing since the change can be performed only by blanking without changing the condition of the electron optical system. The cycle of blanking may be set equal to the cycle of arithmetic mean value processing, and the intensity can be varied within the range. For example, in a case where number of arithmetic mean value processing operations is 8, it is possible to adjust the beam current to eight levels of $\frac{1}{8}$, $\frac{2}{8}$, $\frac{3}{8}$, $\frac{4}{8}$, $\frac{5}{8}$, $\frac{6}{8}$, $\frac{7}{8}$ and $\frac{8}{8}$ (1.0).

The present invention is also effective for confirming fluctuation in the beam current since the blanking is periodically performed.

Figure 4:
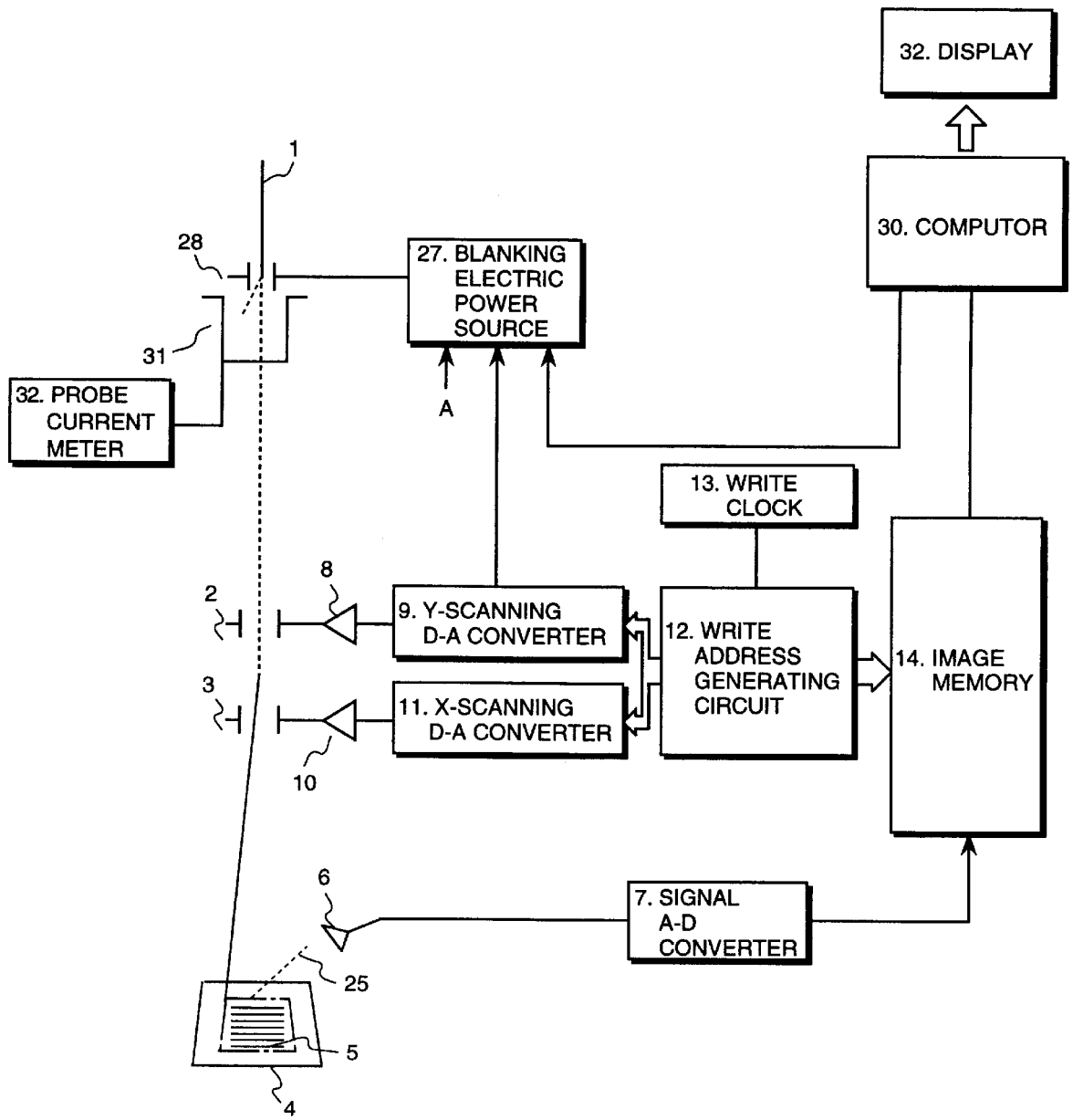
FIG. 4 is a diagram explaining another embodiment of a scanning microscope in accordance with the present invention in which a beam current is measured during blanking.

FIG. 4 shows another embodiment of a scanning microscope in which a beam current is adjusted by actively making use of the present invention. In this embodiment, the electron beam 1 deflected by the blanking deflection plate 28 enters into a blanking cup 31 having an opening in the central portion to be measured by a probe current meter 32 as the beam current. The current measurement is performed by applying a direct current voltage to the blanking deflection plate 28 for a certain time period based on a command from the computer and the measured beam current is stored in the computer. The measured beam current is used as a reference for the beam current. For example, when the measured value is 8 pA, the results may be displayed on the screen (display 32) of the computer as shown in FIG. 5A to FIG. 5B. FIG. 5A shows a case where number of adding operations is 4 and it is possible to select 8, 6, 4 or 2 pA for the beam current. FIG. 5B shows a case where number of adding operations is 8 and it is possible to select 8, 7, 6, 5, 4, 3, 2 or 1 pA for the beam current. Further, when an operator selects any one of the displayed boxes using a key-board or a mouse, the system is constructed to set the blanking condition to the selected one. This embodiment is one of examples, the number of adding operations and the reducing ratio can be freely selected. In this embodiment, the blanking ratio is selected from the displayed boxes. However, it is no need to say that the beam current value can be displayed by inputting a blanking ratio.

According to the present invention, it is also possible that number of blanking operations or amplification of the signal can be automatically set by setting a total value of accumulated beam current or a time period irradiated on the sample.

The system of this type is effective for a case where it is empirically known what amount of beam irradiation may cause shape change or charging-up in an irradiated sample.

By constructing as described above, a number of adding operations and an amplification factor of the signal are set based on such an accumulative beam current value that the aforementioned trouble may not occur.

The blanking electric power source further receives a long term blanking signal for blanking the electron beam 1 from the computer 30 when exchanging the sample and a blanking signal (A) for erasing a scan returning line. Herein, although the long term blanking and the returning line blanking signals are added through a circuital method, an electrode opposite to the blanking deflection plate 28 may be used.

In order to perform blanking, the blanking deflection plate 28 and the blanking cup 31 are provided in the aforementioned embodiment. However, there are the other means to realize the present invention without the blanking deflection plate 28 and the blanking cup 31.

One of the means is that the beam is turned aside from the two-dimensional scanning range of the sample using the scanning deflection plates 2 or 3. In order to do so, it is effective to provide a means for additionally applying such a high voltage to the scanning deflection plate that the beam may be deflected outside the two-dimensional scanning range of the sample during blanking timing.

According to such a construction, it is possible to attain the same effect described above by only performing simple control of the deflection signal without providing any additional component for blanking.

Since there is not provided any blanking cup in this case, secondary electrons are detected during blanking. Therefore, it is not necessary to capture the signal obtained during blanking.

However, by arranging a structure for blanking the beam under the scanning deflection plates 2, 3, this problem can be eliminated.

A very large effect can be attained when the present invention is applied to dimensional measurement in a semiconductor process. In the dimensional measurement in a semiconductor process, automatic operation of a scanning microscope without human operation becomes inevitable in order to improve through-put.

Figure 6:
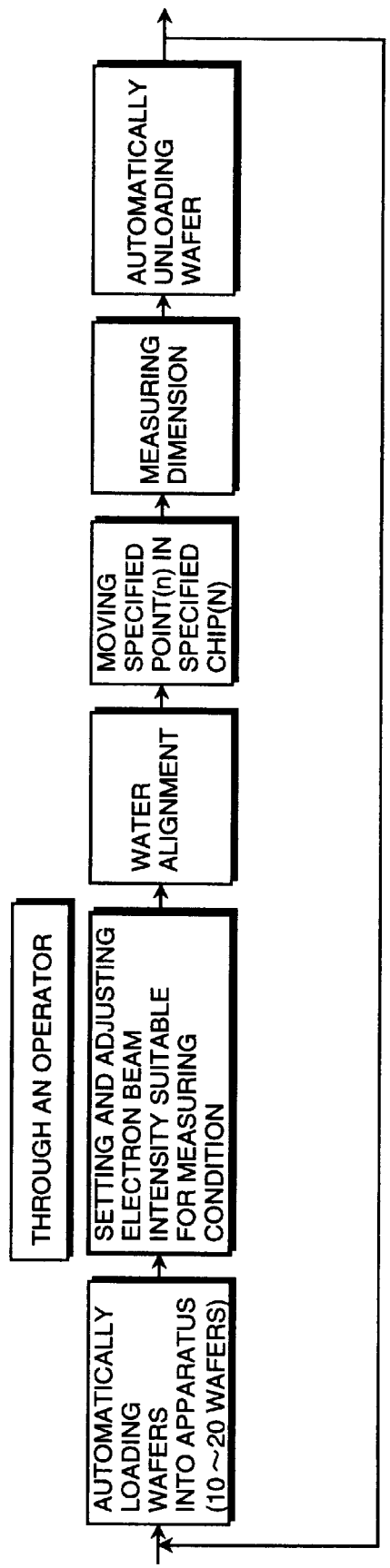
FIG. 6 is a block diagram explaining a conventional flow of a dimensional measurement process of a semiconductor wafer.

FIG. 6 shows a flow for performing dimensional measurement of a semiconductor wafer. Firstly, a conventional measuring flow will be described below. A cassette containing 10 to 20 wafers to be measured is set to an automatic loader. The wafers contained in the cassette are successively extracted one-by-one by a transfer robot to be automatically loaded in an apparatus. Then, an electron optical system is adjusted so as to agree to an electron beam condition suitable for observing the loaded wafer. In dimensional measurement of a semiconductor wafer, energy of the electron beam is as low as nearly 800 V. Although the energy is changed depending on an observing condition in some cases, electron beam energy decreased up to 800 V is applicable to almost all kinds of semiconductor wafers. Therefore, the remaining condition to be set is the beam current condition. An intensity of beam current needs to be appropriately changed depending on a kind of wafer in order to suppress swelling change in measured dimensional value due to contamination, deformation due to heat and measuring error caused by deflection distortion due to charging-up. Setting the beam current requires operator's intervention and an operating time of 10 to 20 minutes. Then, the computer recognizes a position of the wafer by a specified point in the wafer, for example, a marker formed in the periphery of the wafer. By doing so, it is possible to observe and measure a specified arbitrary position. Measurement is performed by selecting specified chips (N) among several tens to several hundreds chips in the wafer and by successively moving to specified points (n) in the specified chip. In a typical example, each of the N and the n is 5, and the total of 25 points are measured. After completion of measurement, the wafer is unloaded and the next wafer is loaded. Setting of the electron beam intensity is not necessary if the next wafer is to be observed under the completely same condition. In general, the electron beam intensity is usually adjusted to a new appropriate condition. At this time, it is required human intervention again. When the series of measuring operations are performed for 20 wafers, the time required for adjustment becomes 200 to 400 minutes whereas it takes 30 minutes for loading and unloading and 30 minutes for actual measurement. Furthermore, the series of measuring operations cannot performed automatically without human intervention, which has hindered the realization an automated semiconductor process without human intervention.

Figure 7:
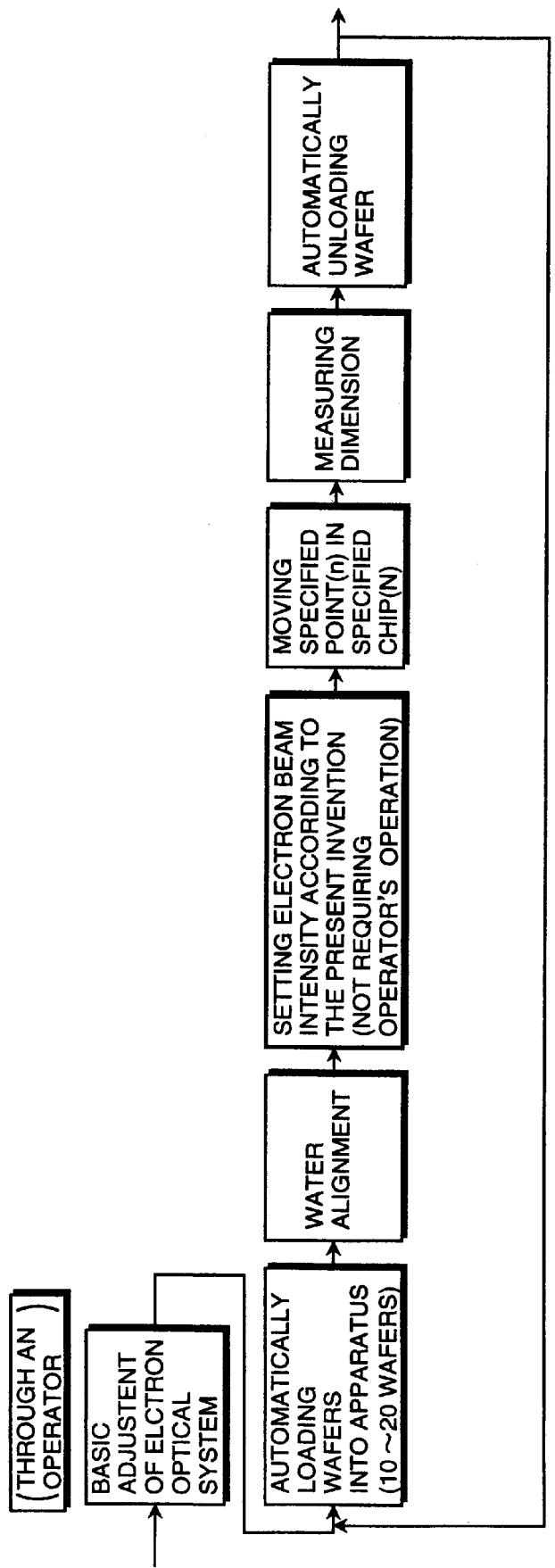
FIG. 7 is a block diagram explaining a flow of a dimensional measurement process in accordance with the present invention.

FIG. 7 shows a flow of dimensional measurement process in accordance with the present invention. In the embodiment, the electron optical system is adjusted using a test sample (for example, a mesh) prior to starting measurement. In this adjustment, the electron beam is adjusted so as to obtain a necessary largest beam current under a continuous irradiation condition. Then, a wafer is loaded and wafer alignment is performed. After completion of the alignment, the electron beam is set to an observation condition of the wafer to be measured through beam current adjustment in accordance with the present invention. After completion of measuring the loaded wafer, the wafer is automatically unloaded. After loading the next wafer, wafer alignment is performed and an intensity of the electron beam is set. According to the embodiment, setting of the electron beam intensity can be completed within a fraction of a second whereas it has taken 10 to 20 minutes in the conventional system. As a result, it is possible to realize high speed and non-human-intervention measurement, wherein it takes 30 minutes for loading and unloading and 30 minutes for measurement.

Further, in the present invention, the means for adjusting electron optical system is designed so as to attain the effect of setting the irradiation intensity to an optimum value based on temperature rise of a sample, charging-up on an insulator and degree of contamination.

That is, when clear image information is required in spite of the harmful influences described above, the number of scanning operations is increased. When the harmful influences described above have to be avoided in any way, the other conditions are set based on a beam current value and/or an accumulative added current value.

As described above, it is possible to provide a scanning electron microscope easy to operate for an experienced operator by constructing the scanning electron microscope so that a measuring condition can be set based on the operator's experience with taking the condition of an objective sample and performance specifications of the scanning electron microscope itself into consideration.

Such an effect can be attained by constructing a scanning electron microscope so as to leave selection on where the priority is put, the number of beam scanning operations, a beam current value or an accumulative added current value, to an operator in the process of the operator's intervention in the dimensional measurement flow described above. In more detail, in the process of the operator's intervention, a display by which the operator can determine the selection on which the priority is put is displayed on the screen of the display unit 32. As the operator performs the selection, the condition given priority is firstly determined and then the other conditions are manually or automatically determined based on the value.

By employing the method of the present invention, it is possible to perform arbitrarily setting of an intensity of the electron beam (beam current) without performing the axial adjustment of the irradiation system which has been a problem on operation of a scanning electron microscope in the past, it is possible to set the irradiation intensity to an optimum value to temperature rise of a sample, charging-up on an insulator and degree of contamination which have been problems in the past, and accordingly it is possible to attain high speed and non-human intervention of automatic measurement in dimensional measurement of semiconductor wafers.

What is claimed is:

1. A scanning microscope for obtaining a scanned image of a shape or composition of a sample by scanning an irradiation beam on the sample and detecting a signal secondarily generated from the sample by irradiation of the irradiation beam, which comprises:
   a two-dimensional scanning unit;
   means to display a scanned image by accumulating two-dimensional scanned images scanned more than two times by said two-dimensional scanning unit, and
   means to block said irradiation beam being scanned by said two-dimensional scanning unit for at least one of the times of scanning by said two-dimensional scanning unit.

2. A scanning microscope according to claim 1, which further comprises means to set the number of the two-dimensional scanning operations required for obtaining one scanned image.

3. A scanning microscope according to claim 1, which further comprises means to set an intensity of said irradiation beam and means to set a number of blocking operations- or a cycle of blocking operations during which said means to block are operated based on the set intensity of said irradiation beam.

4. A scanning microscope according to claim 3, wherein said blocking operations occur within a cycle in which said two-dimensional scanned images are accumulated.

5. A scanning microscope according to claim 3, wherein the number of said blocking operations is smaller than the number of two-dimensional scanning operations accumulated to obtain said scanned image.

6. A scanning microscope according to claim 1, wherein said two-dimensional scanning of the irradiation beam is performed at a scanning frequency equal to or near the commercial television frequency.

7. A scanning microscope according to claim 1, which comprises means to display a ratio of blocking of said irradiation beam.

8. A scanning microscope according to claim 1, wherein blocking ratios executable based on said number of accumulating operations is displayed on a screen of a computer in a form of a list and blocking of the irradiation beam on the sample is executed by selecting a blocking ratio from said displayed list.

9. A scanning microscope according to claim 1, wherein said means to block said irradiation beam comprises a deflecting means for said irradiation beam.

10. A scanning microscope, according to claim 9, wherein said means to block said irradiation beam further comprises an aperture member positioned on a path of the irradiation beam deflected by said deflecting means.

11. A scanning microscope according to claim 10, which further comprises means to measure a quantity of said irradiation beam irradiated on said aperture member.

12. A scanning microscope according to claim 11, wherein an intensity of said irradiation beam is measured in advance, averaged intensities of the irradiation beam being calculated and displayed using said measured intensity and blocking of the irradiation beam being executed with a blocking ratio determined based on an averaged intensity selected from said displayed averaged intensities.

13. A scanning microscope according to claim 1, wherein said means to block said irradiation beam comprises an electrostatic deflection plate provided near the optical path of said irradiation beam and an aperture member whereby said irradiation beam is deviated from the aperture portion of said aperture member by deflection caused by said deflection plate.

14. A scanning microscope according to claim 13, wherein said aperture member is of a cup shape having an aperture in the central bottom portion.

15. A scanning microscope according to claim 1, where in said means to block said irradiation beam comprises said two-dimensional scanning unit.

16. A scanning microscope according to claim 15, wherein said two-dimensional scanning unit blocks the irradiation beam by superposing such a different signal from the scanning signal that the beam is deviated from the region of said two-dimensional scanning on said scanning signal each time said blocking is performed.

17. A measuring-analyzing system comprising means to automatically load and unload a sample, a sample stage controlled by a computer, and a scanning microscope to perform measuring and analyzing of shape, dimension and composition of a sample by detecting a signal secondarily generated from the sample on said sample stage by irradiation of said irradiation beam, wherein said scanning microscope comprises a two-dimensional scanning unit scanning said irradiation beam, means to display a scanned image by accumulating two-dimensional scanned images scanned more than two times, means to block said irradiation beam in a number of blocking scanning operations, each blocking a two-dimensional scan for one of said times, and means for displaying the sample observed by said scanning microscope in which a two-dimensional scanning accumulating cycle and the number of blocking scanning operations is smaller than the number of accumulating operations of the two-dimensional scanning images.

18. A scanning microscope for obtaining a scanned image of a shape or composition of a sample by scanning an irradiation beam on the sample and detecting a signal secondarily generated from said sample by irradiation of said irradiation beam, which comprises means to display a scanned image by accumulating two-dimensional scanned images scanned more than two times, means to display blocking ratios capable of execution based on the number of accumulating operations being displayed on a screen of a computer, and means for blocking at least one of said times of two-dimensional scanning of the irradiation beam on the sample by selecting one of the displayed blocking ratios.

* * * * *

UNITED STATES PATENT AND TRADEMARK OFFICE
CERTIFICATE OF CORRECTION

PATENT NO. : 5,929,439
DATED : 27 July 1999
INVENTOR(S) : Hideo TODOKORO et al.

It is certified that error appears in the above-identified patent and that said Letters Patent is hereby corrected as shown below:

| Column | Line | |
|---|---|---|
| 1 | 29 | Change "is" to --are--. |
| 2 | 2 | Change "ditions" to --dition--. |
| 5 | 49 | Replace "no need to say" with --understood--. |
| 6 | 35 | Change "Firstly" to --First--. |
| 7 | 5 | Change "whereas" to --while--. |
| 7 | 8 | After "cannot" insert --be--. |
| 7 | 9 | Before "an" insert --of--. |
| 7 | 61 | Change "firstly" to --first--. |
| 8 | 29 | Change "operations-" to -- operations --. |
| 9 | 13 | Change "where in" to --wherein--. |

Signed and Sealed this

Sixth Day of June, 2000

Attest:

Q. TODD DICKINSON

*Attesting Officer*   *Director of Patents and Trademarks*